US007872596B2

(12) United States Patent
Schneider

(10) Patent No.: US 7,872,596 B2
(45) Date of Patent: Jan. 18, 2011

(54) DICTIONARY-BASED COMPRESSION

(75) Inventor: James Paul Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 44 days.

(21) Appl. No.: 12/393,998

(22) Filed: Feb. 26, 2009

(65) Prior Publication Data

US 2010/0214136 A1 Aug. 26, 2010

(51) Int. Cl.
*H03M 7/34* (2006.01)
(52) U.S. Cl. .......................... 341/51; 382/233; 382/244
(58) Field of Classification Search ........... 341/50–106; 382/233, 244, 100
See application file for complete search history.

(56) References Cited

U.S. PATENT DOCUMENTS

| | | | | |
|---|---|---|---|---|
| 5,373,290 A | * | 12/1994 | Lempel et al. | 341/51 |
| 5,455,576 A | * | 10/1995 | Clark et al. | 341/50 |
| 5,532,693 A | | 7/1996 | Winters et al. | |
| 5,831,558 A | * | 11/1998 | Harvell | 341/106 |
| 6,529,912 B2 | * | 3/2003 | Satoh et al. | 707/693 |
| 7,164,370 B1 | | 1/2007 | Mishra | |
| 7,181,388 B2 | * | 2/2007 | Tian | 704/10 |

OTHER PUBLICATIONS

Alistair Moffat, "Implementing the PPM Data Compression Scheme", Transactions Letters, IEEE Transactions on Communications, vol. 38, No. 11, Nov. 1990, 5 pages.
"The LZ77 algorithm", Data Compression Reference Center, 1997, 2 pages.
"The LZ78 algorithm", Data Compression Reference Center, 1997, 2 pages.

* cited by examiner

*Primary Examiner*—Lam T Mai
(74) *Attorney, Agent, or Firm*—Blakely, Sokoloff, Taylor & Zafman LLP

(57) ABSTRACT

A method and apparatus for compressing data is described. A compressor builds a dictionary associated with the characters in the input string. A table in the dictionary is generated by looking backward from a current character being encoded in the input string to determine the last time the most recent one or more characters have occurred. The compressor determines whether the following characters at a point of encoding matches the next character being encoded.

20 Claims, 5 Drawing Sheets

|  | INDEX | DEVIATING SYMBOL | NEW ENTRY | DICTIONARY |
|---|---|---|---|---|
| ABACADABRA | 0 | 'A' | 1 | "A" |
| A BRACADABRA | 0 | 'B' | 2 | "B" |
| AB RACADABRA | 0 | 'R' | 3 | "R" |
| ABR ACADABRA | 1 | 'C' | 4 | "AC" |
| ABRAC ADABRA | 1 | 'D' | 5 | "AD" |
| ABRACAD ABRA | 1 | 'B' | 6 | "AB" |
| ABRACADAB RA | 3 | 'A' | 7 | "RA" |

FIG. 3

DICTIONARY-BASED COMPRESSION

TECHNICAL FIELD

Embodiments of the present invention relate to data compression, and more particularly, to improving the compression ratio of a compression algorithm.

BACKGROUND

Data compression or source coding is the process of encoding information using fewer bits than an unencoded representation would use through use of specific encoding schemes. As with any communication, compressed data communication only works when both the sender and receiver of the information understand the encoding scheme.

Dictionary-based encoding systems typically involve an encoding algorithm for encoding an input stream that avoids duplication by producing an encoded stream that assigns codes to input strings that are repeated in the input stream. The decoding system typically applies the same algorithm in the reverse order to decode the encoded stream to provide a decoded output stream. Conventional dictionary-based systems typically output codes that are generally all of one or two fixed lengths, or a length that depends on the size of the input processed so far.

BRIEF DESCRIPTION OF THE DRAWINGS

The present invention is illustrated by way of example, and not by way of limitation, in the figures of the accompanying drawings and in which:

FIG. 3 is a table illustrating a traditional dictionary-based compression.

DETAILED DESCRIPTION

Described herein is a method and apparatus for compressing data. A compressor builds a dictionary associated with the characters in the input string. A table in the dictionary is generated by looking backward from a current character being encoded in the input string to determine the last time the most recent one or more characters have occurred. The compressor determines whether the following characters at a point of encoding matches the next character being encoded.

Figure 1:
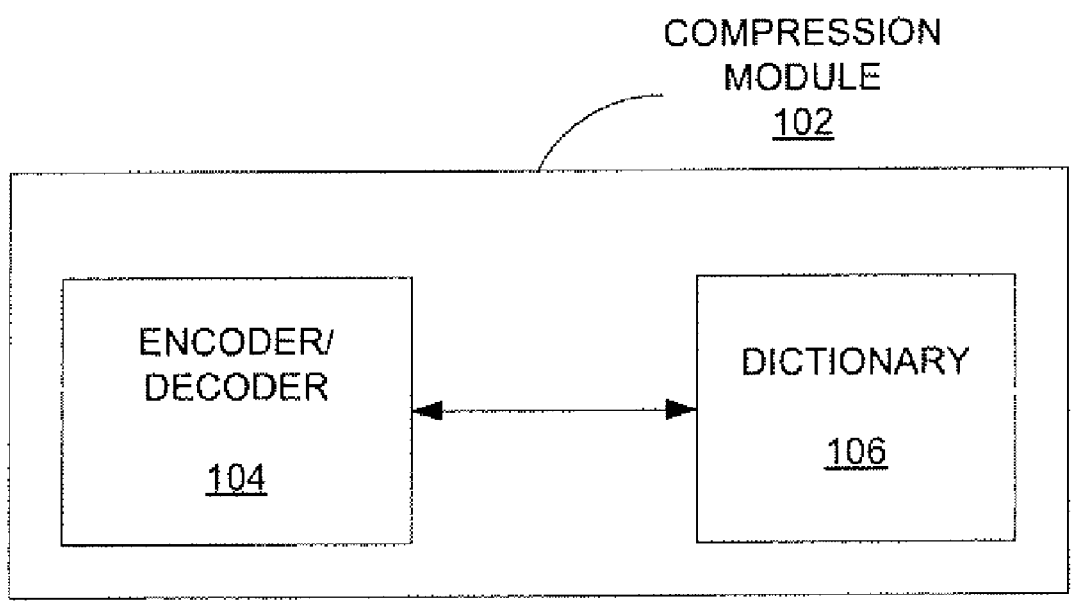
FIG. 1 is a block diagram illustrating one embodiment of a dictionary-based compressor.

FIG. 1 is a block diagram illustrating a dictionary-based compressor 102. In one embodiment, dictionary-based compressor 102 includes an encoder/decoder module 104, and a storage module 106. Encoder/decoder module 104 builds a dictionary in storage module 106. The dictionary is associated with characters in an input string to be compressed. Encoder/decoder module 104 processes each character in the input string sequentially. In particular, encoder/decoder module 104 generates a table in the dictionary by looking backward from a current character being encoded in the input string to determine the last time the most recent one or more characters have occurred, and to determine whether the following characters at a point of encoding matches the next character being encoded. By doing so, encoder/decoder 104 uses prediction by partial matching to construct coding tables based on the recently encountered input context. Storage module 106 stores the tables in the dictionary. The operations of encoder/decoder module 104 are described in more detail below with respect to FIG. 4.

Figure 2:
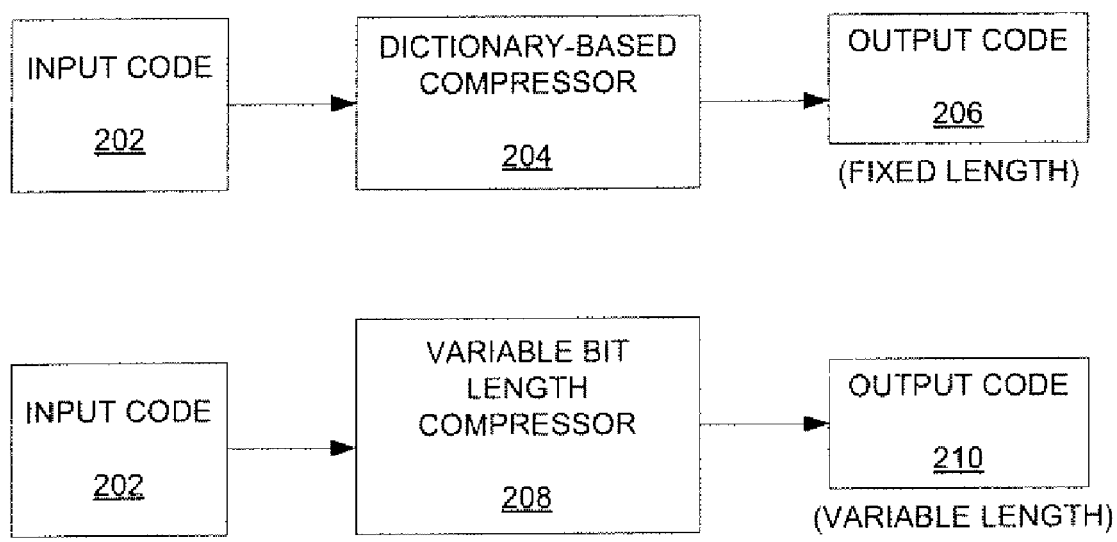
FIG. 2 is a block diagram illustrating a traditional dictionary-based compressor and a variable bit length compressor.

FIG. 2 is a block diagram illustrating a traditional dictionary-based compressor 204 and a variable bit length compressor 208. With the traditional dictionary-based compressor 204, the output codes 206 are generally all of one or two fixed lengths, or a length that depends on the size of the input code 202 processed so far. With the variable bit length compressor 208, a dictionary made up of all or part of the input stream 202 is used to generate variable length codes for the output code 210. In one embodiment, the present decoder/encoder is hybrid of both traditional compression techniques. The present decoder/encoder does so by looking back in the dictionary for the last time the most recent several characters have occurred, and see if the following character at that point matches the next character being encoded.

FIG. 3 is a table illustrating a traditional dictionary-based compression. The input string being encoded is "ACABRADABRA". The first column illustrates which character is being processed. The second column illustrates the index. The third column illustrates the deviating symbol. The fourth column illustrates the new entry in the dictionary.

Figure 4:
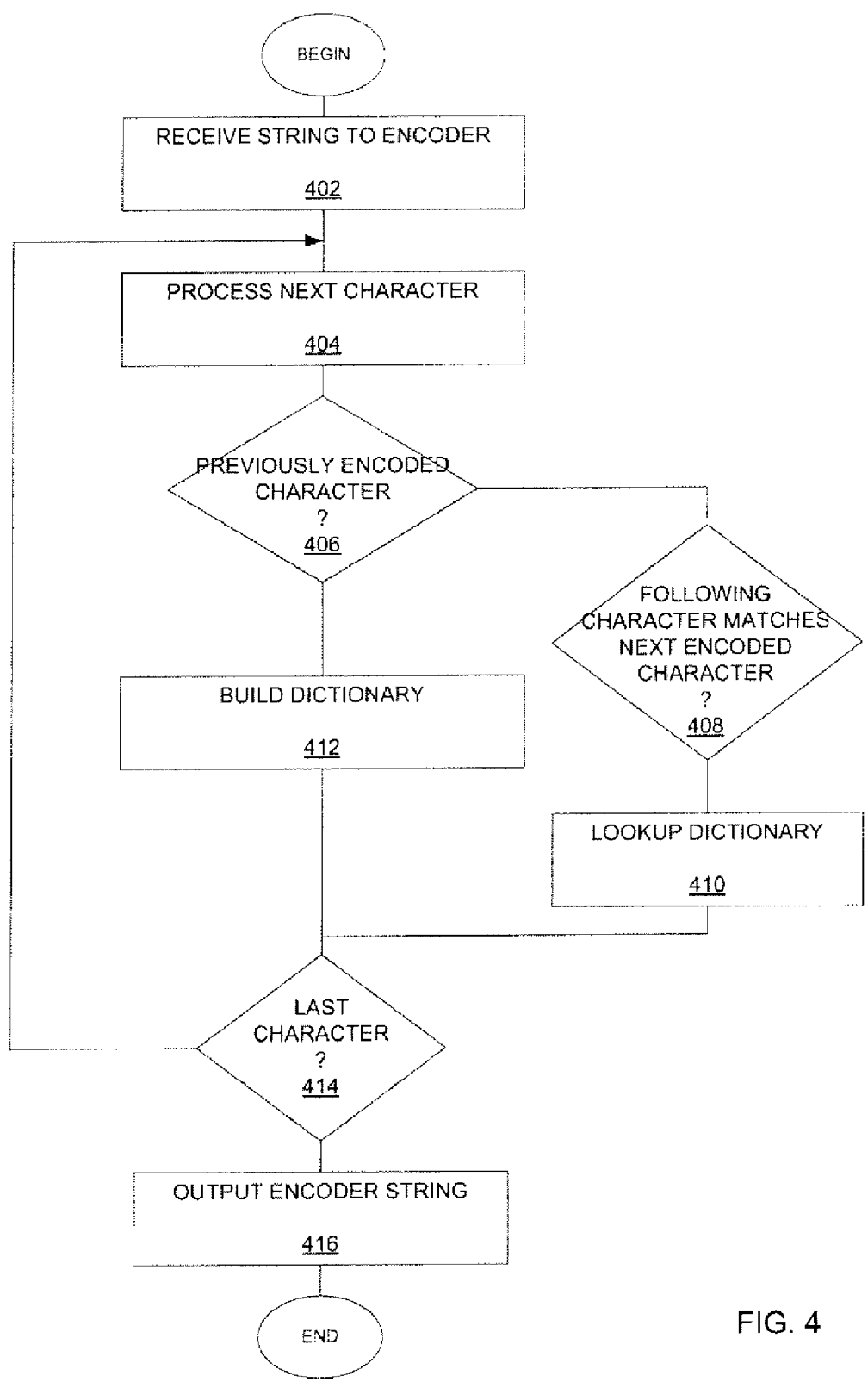
FIG. 4 is a flow diagram of one embodiment of a method for compression.

FIG. 4 is a flow diagram of one embodiment of a method for compression. At 402, an input string to be compressed is received at the decoder/encoder module. Each character from the input string is processed sequentially at 404. At 406, the decoder/encoder module determines whether the current character being processed has already been previously encoded. At 408, the decoder/encoder module determines whether the following character at that point matches the next character being encoded. At 410, the decoder/encoder module looks up the dictionary. If the character being processed has not already been encoded, a dictionary is built based on the character being processed at 412. When the last character of the input string has been processed at 414, the decoder/encoder generates an output string. The following is an example illustrating the above compression method.

For example, coding the string "abracadabra": at the first input character, there is nothing in the dictionary, so the first "a" is passed directly. It can be put into the output directly, or it can put into a separate "literals" stream. This example uses a separate literal stream since a separate literals stream is more flexible.

At "ab̲racadabra", the coder has just coded its first "a", so it cannot use the "a" context to make a prediction about what we expect. However, since the coder has coded something, the " " context exists, and has more than one entry. Looking backwards from the current point in the input, the coder can construct the following table of possibilities:

| Index | Character |
| --- | --- |
| 0 | 'a' |
| 1 | None |

Since the coder cannot code 'b' from here, it adds the code for the "None" entry to the code stream, and the literal to the literals stream (which becomes "ab").

At "ab̲racadabra", the coder has a three-entry table with "b", "a", and "None". Since "r" does not appear, the code for "None" is added to the code stream, and "r" gets added to the literals stream. So, the code stream is 1/2, 2/3, and the literals stream is "abr"—the fraction values are to keep track of how many possibilities there were when the code was generated.

At "abra̱cadabra", the coder has the four-entry table "r", "b", "a", and "None". "a" shows up in the table at offset 2, so the code 2/4 is added to the output stream.

At "abrac̱adabra", the coder was able to successfully code something, so it begins by trying to code the current character in the context of the code it just generated—it looks backwards for every occurrence of "a", and attempts to match the current character against the following character for each occurrence. Looking just at the instances of "a", the following table gets generated:

| Index | Character |
|-------|-----------|
| 0     | 'b'       |
| 1     | None      |

So, the coder cannot code "c" from this context—it emits the code for "None" (1/2, in this context), and tries again from the previous context. At this point, there are some implementation decisions that affect the ultimate coding, but for now assume each character is only counted once in a particular context, and shorter contexts do not contain letters that appear in longer parent contexts. So, in the " " context (which is where the coder goes when it discovers it can't code from the "a" context), the code table is "a", "r", "None". "None" is the appropriate code here, so the "None" code (2/3) goes into the stream, and "c" gets added to the literals stream, making the code stream 1/2, 2/3, 2/4, 1/2, 2/3, and the literals stream "abrc").

At "abraca̱dabra", the coder is again coding from the " " context, which has the table "c", "a", "r", "b", "None". The code emitted is 1/5, making the code stream 1/2, 2/3, 2/4, 1/2, 2/3, 1/5.

At "abracaḏabra", the coder is coding from the "a" context, which contains "c", "b", and "None"—the coder cannot code "d" here, so it emits the code 2/3, and goes to the " " context, which has the table "a", "r", "None". The emitted code is 2/3, making the code stream 1/2, 2/3, 2/4, 1/2, 2/3, 1/5, 2/3, 2/3, and the "d" gets added to the literals stream, making it "abrcd".

At "abracada̱bra", the coder is coding from the " " context, which can code "d", "a", "c", "r", "b", "None". The coder emits the code 1/6, making the code stream 1/2, 2/3, 2/4, 1/2, 2/3, 1/5, 2/3, 2/3, 1/6.

At "abracadaḇra", the coder is coding from the "a" context, which can code "d", "c", "b", "None". The emitted code is 2/4, making the code stream 1/2, 2/3, 2/4, 1/2, 2/3, 1/5, 2/3, 2/3, 1/6, 2/4.

At "abracadabṟa", since the coder successfully coded from the "a" context, it attempts to code from the "ab" context now, which can code "r" or "None". The resulting code is 0/2, making the code stream 1/2, 2/3, 2/4, 1/2, 2/3, 1/5, 2/3, 2/3, 1/6, 2/4, 0/2.

The final "a" is coded in the "abr" context, which can code "a" or "None", giving the code 0/2, making the code stream 1/2, 2/3, 2/4, 1/2, 2/3, 115, 2/3, 2/3, 1/6, 2/4, 0/2, 0/2.

If the coder is going to signal an explicit end-of-stream indicator, it can do so by coding a final "None" from the " " context, without appending a literal to the literals stream. The coder is in the "abra" context, which can code "c" or "None". The coder would emit 1/2 here, and go to the "bra" context. Since the longer context could not use the "c", the "c" does not go into the code table for this context, either—in other words, no code need be emitted for the "None" in "bra" context, and the "ra" context is exited the same way, bringing the coder to the "a" context, which can code "b", "d", and "None" The coder chooses "None", with a code of 2/3. At the " " context, the table is "a", "r", "None", so the code generated here is 2/3.

The final code stream becomes 1/2, 2/3, 2/4, 1/2, 2/3, 1/5, 2/3, 2/3, 1/6, 2/4, 0/2, 0/2, 1/2, 2/3, 2/3, and the final literals stream becomes "abrcd".

The codes in the code stream can each be coded in an integral number of bits (so, 0/2 becomes a single bit 0, 1/2 becomes a single bit 1, 2/3 and 2/4 both become the two bits 10, and 1/5 and 1/6 both become the three bits 001), which would result in a code stream size of 27 bits—the literals stream can be coded in 36 bits. Thus, the entire 11 byte string "abracadabra" can be compressed to 63 bits, or just a shade under 8 bytes.

Alternatively, the fractions can define the endpoints of ranges to use in range coding, which gives a coding of 24 bits for the code stream, or 60 bits for the whole string.

The following is an example of one embodiment of how the compressor decodes an input stream. Decoding the code stream entails creating the tables in the same order as they were created during coding.

Starting at the beginning, the decoder would consume the first literal, and nothing from the code stream, making the output "a". From this, it can construct a coding table for the " " context that contains the "a" and "None" entries. Since the table has two entries, the coder knows it needs a code fraction with a denominator of 2—an integral bit encoder would just consume a single bit from the code stream, while a fractional bit encoder would extract the code value from the code stream.

The decoder gets the 1/2 code, which indicates that this is the "None" code. The decoder then consumes the next entry in the literals stream ("b"), and adds that to the output, so the output is now "ab". The decoder also constructs the coding table, which contains the entries "b", "a", and "None". It pulls a fractional code with a denominator of 3 from the code stream.

The decoder gets the 2/3 code, which is the "None" code, and consumes the next literal from the literals stream ("r"), adding it to the output, which is now "abr". The coding table constructed at this point is "r", "b", "a", "None", which has four entries. The decoder pulls a code with a denominator of 4 from the code stream.

The decoder gets the 2/4 code, which corresponds to the "a" entry in the code table, so it adds "a" to the output, to give "abra". The decoder also constructs a code table from the bytes that have been coded after "a"'s in the output, which gives it the code table of "b", "None", implying a denominator of 2 for the next code.

The decoder gets the 1/2 code, which corresponds to "None". This exits the decoder from the "a" context, and enters it into the " " context. In this context, the decoder constructs a coding table that contains "a", "r", and "None", with a denominator of 3.

The decoder gets the 2/3 code, which corresponds to "None". The decoder extracts the next literal ("c") from the literals stream and adds it to the output, which is now "abrac". The coding table constructed here is "c", "a", "r", "b", "None", for a denominator of 5.

The decoder gets the 1/5 code, which corresponds to "a". The decoder adds the "a" to the output, making it "abraca", and constructs a table for the "a" context, which contains "c", "b", "None".

The decoder then gets the 2/3 code, corresponding to "None", exiting the "a" context for the " " context. The coding table in this context contains the entries "a", "r", "None".

The decoder gets the next code (2/3), which again corresponds to "None". This causes the decoder to consume the last literal ("d"), and add it to the output stream, which is now "abracad". The table constructed at this point is "d", "a", "c", "r", "b", "None", so the decoder uses a denominator of 6 for the next code.

The next code (1/6) indicates "a", so "a" gets added to the output, making it "abracada". The coding table constructed at this stage is "d", "c", "b", "None", so the next denominator is 4.

The next code (2/4) indicates "b", so "b" gets added to the output, making it "abracadab". The coding context at this point is "ab", which has a table of "r", "None".

The next code (0/2) indicates "r", so "r" gets added to the output, which is now "abracadabr". The coding context table for "abr" is "a", "None".

The next code (0/2) indicates "a", so "a" gets added to the output, which is now "abracadabra". The coding context table for "abra" is "c", "None".

The next code (1/2) indicates "None", so the decoder exits the "abra" context. The "bra" context and the "ra" context are both empty coming from the "abra" context, so that leaves the "a" context, which has a coding table of "d", "b", "None"

The next code (2/3) also indicates "None", so the decoder exits the "a" context. By this path, the only things remaining in the " " context table are "a", "r", and "None".

The next code (2/3) also indicates "None". Since we have no more literals, this indicates end-of-stream, making the final output "abracadabra".

In another embodiment, the above compression method may be implemented in conjunction with other compression techniques such as Burrows-Wheeler block sorting, which takes a string and sorts all of the cyclic permutations of the string, and then keeps the last row of characters (or bytes, for a byte compressor). For example, the string "abracadabra" has the following cyclic permutations (where '*' is the end of stream designator):

abracadabra*
bracadabra*a
racadabra*ab
acadabra*abr
cadabra*abra
adabra*abrac
dabra*abraca
abra*abracad
bra*abracada
ra*abracadab
a*abracadabr
*abracadabra Since the end-of-stream is ignored during the sort, the last permutation can be dropped. Sorting the remaining strings gives:

a*abracadabr
abra*abracad
abracadabra*
acadabra*abr
adabra*abrac
bra*abracada
bracadabra*a
cadabra*abra
dabra*abraca
ra*abracadab
racadabra*ab The last row gives the string rd*rcaaaabb; normally, this would be represented as the string "rdrcaaaabb" and a pointer to the end of the block (which would be 2). This can be reconstructed by successively sorting partial strings. Starting with the string "rdrcaaaabb", sort the bytes to get "aaaabcdrr". Arranging the two strings vertically (with the string that is decoded first) gives:

ra
da
ra
ca
ab
ab
ac
ad
br
br

This is all of the pairs of characters in the original string. Sorting this list of strings and prepending the original string gives:

rab
dab
rac
cab
abr
abr
aca
ada
bra
bra

This gives a list of all of the three character strings. Continued sorting and prepending reconstruct the original string. This can be done in place, without actually reconstructing the original table of strings (and the original transform can also be done in place).

Using the new algorithm, coding would proceed like this:
Nothing is available, so the "r" is added to the literals stream directly.

At r̲drcaaaabb, nothing can be coded from the "r" context, so the " " context is examined, which has the table:
Nothing—0
"r"—1

So, a single 0 bit is added to the code stream, and "d" is added to the literals stream, which is now "rd".

At rd̲rcaaaabb, nothing can be coded in the "rd" context or "d" context, since this is the first time they've been encountered. The " " context has the following table:
Nothing—0
"r"—1
"d"—2

The "r" can be coded from this context, so the bits 01 get added to the code stream (which is now 001). The literals stream remains "rd".

At rdr̲caaaabb, the coder goes to the "r" context, which has the following table:
Nothing—0
"d"—1

Since "c" can't be coded here, the coder emits a 0 bit, and goes to the " " context. The " " context has the following table here:
Nothing—0
"r"—1

Again, a 0 bit is added to the code stream, and "c" gets added to the literals stream. The code stream is now 0010 0, and the literals stream is "rdc".

At rdrcaaaabb, since "c" went all the way back to " ", the coder can only code from the " " context, which has the following table:

Nothing—0
"r"—1
"d"—2
"c"—3

The coder would emit the bits 00 to the code stream, which becomes 0010 000 and adds "a" to the literals stream, which would become "rcda".

At rdrcaaaabb, since "a" was coded from " ", the coder would be in the " " context, which has the following table:

Nothing—0
"r"—1
"d"—2
"c"—3
"a"—4

"a" would be coded as 100, making the code stream 0010 0001 00. The literals stream remains "rcda".

At rdrcaaaabb, the coder can code from the "a" context, which has the following table:

Nothing—0
"a"—1

"a" gets coded as 1, making the code stream 0010 0001 001. The next (and final) "a" is coded from the "aa" context, which also codes "a" as 1, making the code stream 0010 0001 0011.

At rdrcaaaabb, the coder tries to code from the "aaa", "aa", and "a" contexts, all of which add a 0 bit to the end of the code stream. The " " context would code from the table:

Nothing—0
"r"—1
"d"—2
"c"—3

So, coding the "b" would add a total of five 0 bits to the code stream, and the "b" gets added to the literals stream. So, the code stream becomes 0010 0001 0011 0000 0 and the literals stream becomes "rdcab".

The final "b" is coded from the " " context, which has the table:

Nothing—0
"r"—1
"d"—2
"c"—3
"a"—4
"b"—5

This results in a final code stream of 0010 0001 0011 0000 0101, a final literals stream of "rdcab", and a pointer value of 2. There is an implementation of the Burrows-Wheeler transform that doesn't require a separate pointer, so I'll neglect the size of the pointer in the following size calculation:

Bits of code stream—20
Literals stream contains 5 bytes-36 bits

So the 11 byte string "abracadabra" can be compressed to 7 bytes. This is a 7 bit (or 11%) improvement over the first example. It should be noted that Burrows-Wheeler block sorting typically increases compression performance (with respect to bits used in the resulting coding) with larger strings. Thus, a larger example would probably show a larger incremental improvement.

Figure 5:
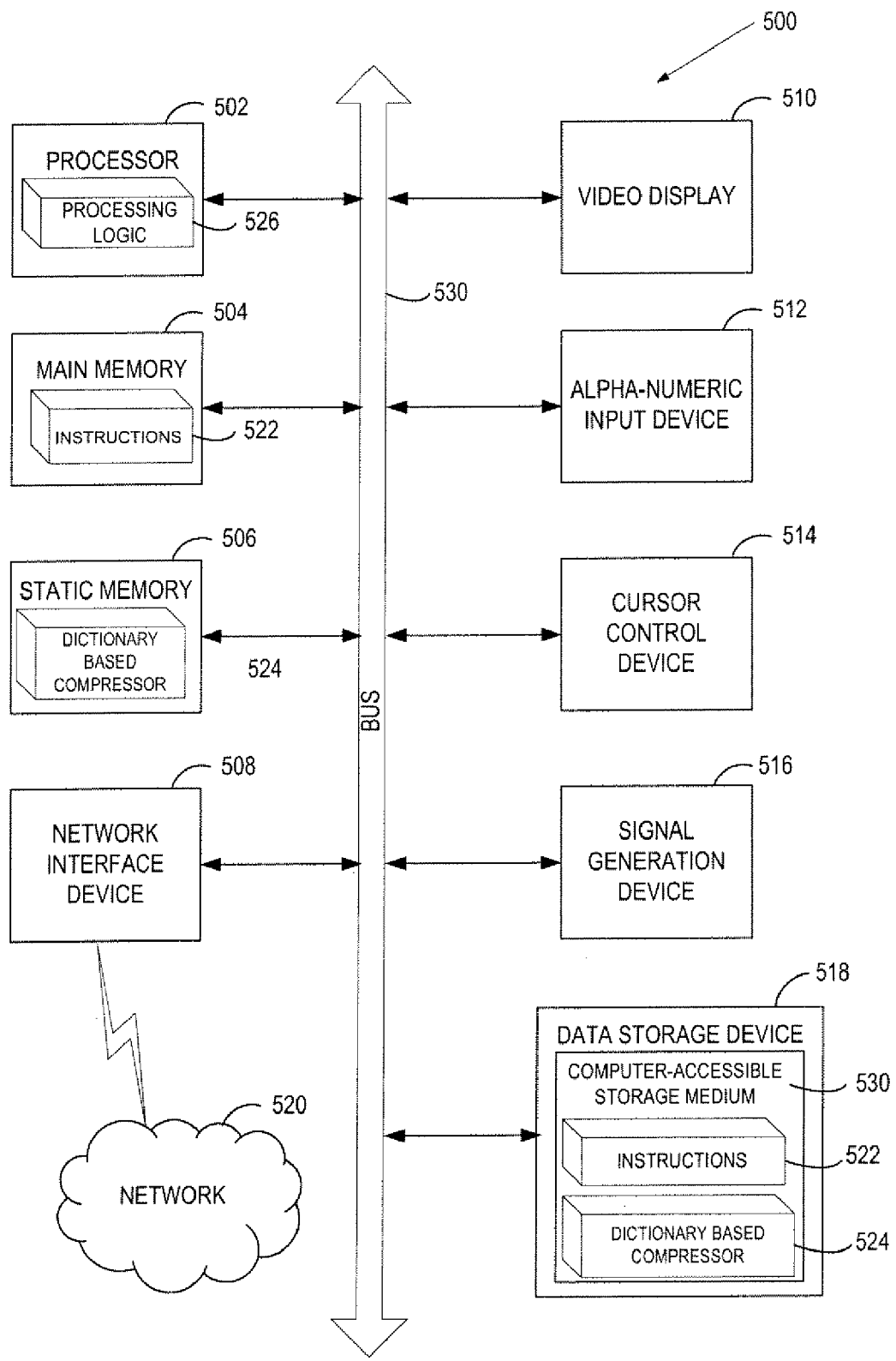
FIG. 5 is a block diagram of an exemplary computer system.

FIG. 5 illustrates a diagrammatic representation of a machine in the exemplary form of a computer system 500 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client machine in client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 500 includes a processing device 502, a main memory 504 (e.g., read-only memory (ROM), flash memory, dynamic random access memory (DRAM) such as synchronous DRAM (SDRAM), a static memory 506 (e.g., flash memory, static random access memory (SWAM), etc.), and a data storage device 518, which communicate with each other via a bus 530.

Processing device 502 represents one or more general-purpose processing devices such as a microprocessor, central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. The processing device 502 is configured to execute the processing logic 526 for performing the operations and steps discussed herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The data storage device 518 may include a machine-accessible storage medium 530 on which is stored one or more sets of instructions (e.g., software 522) embodying any one or more of the methodologies or functions described herein. The software 522 may also reside, completely or at least partially, within the main memory 504 and/or within the processing device 502 during execution thereof by the computer system 500, the main memory 504 and the processing device 502 also constituting machine-accessible storage media. The software 522 may further be transmitted or received over a network 520 via the network interface device 508.

The machine-accessible storage medium 530 may also be used to store a compression algorithm 524 as presently described. The compression algorithm 524 may also be stored in other sections of computer system 500, such as static memory 506.

While the machine-accessible storage medium 530 is shown in an exemplary embodiment to be a single medium, the term "machine-accessible storage medium" should be taken to include a single medium or multiple media (e.g., a centralized or distributed database, and/or associated caches and servers) that store the one or more sets of instructions. The term "machine-accessible storage medium" shall also be taken to include any medium that is capable of storing, encoding or carrying a set of instructions for execution by the machine and that cause the machine to perform any one or more of the methodologies of the present invention. The term "machine-accessible storage medium" shall accordingly be taken to include, but not be limited to, solid-state memories, optical and magnetic media, and carrier wave signals.

FIG. 6 illustrates an apparatus 600 for compressing data. The apparatus 600 includes a numerical processor 602, a logical processor 604, and a variable context dynamic encoder 606. The numerical processor 602 receives one or more strings of data to be compressed. The logical processor 604 is coupled to the numerical processor and replaces duplicate strings with pointers using a first compression algorithm. The variable context dynamic encoder 606 is coupled to the logical processor and processes an output of the logical processor with a second compression algorithm. In one embodiment, the first compression algorithm includes a LZSS algorithm or a LZMA algorithm. In one embodiment, the second compression algorithm includes an adaptive Huffman encoder, or a range encoder.

In the above description, numerous details are set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A computer-implemented method for encoding an input string comprising:
   building a dictionary associated with the characters in the input string using a dictionary-based compressor;
   generating a table in the dictionary by looking backward from a current character being encoded in the input string to determine the last time the most recent one or more characters have occurred; and
   determining whether the following characters at a point of encoding matches the next character being encoded.

2. The method of claim 1 further comprising:
   generating an output code stream and an output literal stream using the dictionary.

3. The method of claim 1 wherein generating further comprises:
   modeling the input string using prediction by partial matches of the characters.

4. The method of claim 2 further comprising:
   coding the code stream in an integral number of bits.

5. The method of claim 2 further comprising:
   coding the literal stream in an integral number of bits.

6. The method of claim 1 further comprising:
   performing a Burrows-Wheeler block sorting on the input string; and
   building the dictionary based on the Burrows-Wheeler block sorting.

7. A non-transitory computer-accessible storage medium including data that, when accessed by a computer system, cause the computer system to perform a method for encoding an input string comprising:
   building a dictionary associated with the characters in the input string;
   generating a table in the dictionary by looking backward from a current character being encoded in the input string to determine the last time the most recent one or more characters have occurred; and
   determining whether the following characters at a point of encoding matches the next character being encoded.

8. The non-transitory computer-accessible storage medium of claim 7 wherein the method further comprises:
   generating an output code stream and an output literal stream using the dictionary.

9. The non-transitory computer-accessible storage medium of claim 7 wherein the method further comprises:

modeling the input string using prediction by partial matches of the characters.

10. The non-transitory computer-accessible storage medium of claim 8 wherein the method further comprises:
coding the code stream in an integral number of bits.

11. The non-transitory computer-accessible storage medium of claim 8 wherein the method further comprises:
coding the literal stream in an integral number of bits.

12. The non-transitory computer-accessible storage medium of claim 7 wherein the method further comprises:
performing a Burrows-Wheeler block sorting on the input string; and
building the dictionary based on the Burrows-Wheeler block sorting.

13. An apparatus for encoding an input string comprising:
a compressor configured to build a dictionary associated with characters in the input string, to generate a table in the dictionary by looking backward from a current character being encoded in the input string to determine the last time the most recent one or more characters have occurred, and to determine whether the following characters at a point of encoding matches the next character being encoded; and
a storage device coupled to the compressor, the storage device configured to store a dictionary.

14. The apparatus of claim 13 wherein the compressor is configured to generate an output code stream and an output literal stream using the dictionary.

15. The apparatus of claim 13 wherein the compressor is configured to model the input string using prediction by partial matches of the characters.

16. The apparatus of claim 14 wherein the compressor is configured to code the code stream in an integral number of bits.

17. The apparatus of claim 14 wherein the compressor is configured to code the literal stream in an integral number of bits.

18. The apparatus of claim 13 wherein the compressor is configured to perform a Burrows-Wheeler block sorting on the input string, and to build the dictionary based on the Burrows-Wheeler block sorting.

19. A computing system comprising:
a processor configured to build a dictionary associated with characters in the input string, to generate a table in the dictionary by looking backward from a current character being encoded in the input string to determine the last time the most recent one or more characters have occurred, and to determine whether the following characters at a point of encoding matches the next character being encoded; and
a memory coupled to the processor, the memory configured to store the dictionary.

20. The computing system of claim 19 wherein the compressor is configured to perform a Burrows-Wheeler block sorting on the input string, and to build the dictionary based on the Burrows-Wheeler block sorting.

* * * * *